United States Patent [19]

Nicolson et al.

[11] 3,755,696

[45] Aug. 28, 1973

[54] DETECTOR HAVING A CONSTANT FALSE ALARM RATE AND METHOD FOR PROVIDING SAME

[75] Inventors: Alexander M. Nicolson, Concord; Robert J. Brophy, Waltham, both of Mass.

[73] Assignee: Sperry Rand Corporation, Great Neck, N.Y.

[22] Filed: Oct. 14, 1971

[21] Appl. No.: 189,286

[52] U.S. Cl. .................. 307/296, 307/235, 307/246, 307/283

[51] Int. Cl. .......................................... H03k 17/00

[58] Field of Search .................... 307/246, 283, 296, 307/297, 235, 231

[56] References Cited

UNITED STATES PATENTS 3,280,340 10/1966 Anderson et al. .............. 307/297 X

*Primary Examiner*—Stanley D. Miller, Jr.
*Assistant Examiner*—B. P. Davis
*Attorney*—Howard P. Terry

[57] ABSTRACT

A detector which may be subject to temperature variations and power supply drift comprised of an avalanche transistor circuit having a variable threshold that is sensitive to input signals within a useful frequency band and noise which produces threshold signals when the amplitude of the input signals or the noise exceeds the instantaneous value of the variable threshold. The rate at which the threshold signals are produced is determined in an N bit storage device coupled to the avalanche transistor circuit and clocked at a specific repetition rate. The storage device has each stage coupled in parallel to an AND gate and to a summation network. The AND gate produces an output signal which indicates input signals are present when each stage of the storage device applies a specified output signal to the AND gate. The summation network produces a variable output signal having an amplitude that varies at a rate proportional to the rate at which the threshold signals are produced. The variable amplitude signal is applied to a serial circuit which shunts the collector current of the avalanche transistor circuit at a rate commensurate with the rate the variable amplitude signal varies in response to noise but at a substantially lower rate than the rate the variable amplitude signal varies in response to input signals. The serial circuit thereby controls the threshold sensitivity of the avalanche transistor to provide a constant false alarm rate for the apparatus while also compensating for temperature variations and drift in the voltage level of the power supply.

25 Claims, 5 Drawing Figures

INVENTORS
ALEXANDER M. NICOLSON
ROBERT J. BROPHY
BY
H P Terry
ATTORNEY

INVENTORS
ALEXANDER M. NICOLSON
ROBERT J. BROPHY
BY
H P Terry
ATTORNEY

DETECTOR HAVING A CONSTANT FALSE ALARM RATE AND METHOD FOR PROVIDING SAME

BACKGROUND OF THE INVENTION

1. Field of the Invention

The present invention relates to the art of detector circuits and particularly to circuits which must respond to input signals that have amplitudes which are within the same range as the amplitude of the noise present within the useful frequency band of the detector.

2. Description of the Prior Art

A basic problem in prior art detector circuits is the generation of an indication that a signal is present above the threshold of the detector circuit when in fact a signal is not present but the erroneous indication is produced as a result of noise. This noise may be defined as any unwanted disturbance within the useful frequency band which will cause the detector to produce a false indication that a signal is present. This false indication is referred to as a false alarm and the rate at which these false indications are produced is referred to as the false alarm rate.

The false alarm rate has been minimized in prior art detector circuits through the application of the following basic techniques; first, pass band filtering which allows only signals and noise within a specific pass band to be applied to the detector circuit input; second, raising the threshold level of the detector circuit above that of the noise so that only signals above the threshold level will generate a signal which indicates a signal is present; and third, gating the detector for only the relatively short period of time when a signal is expected to be present. Obviously, by increasing the threshold level of the detector so that of the noise, requires that the signal to be detected must be larger than that of the noise within the frequency pass-band of interest. However, as the frequency pass-band of the signal is increased the benefit produced by the filtering technique decreases and the importance of increasing the threshold level and the gating techniques are increased. Further, if the level of the signal is approximately the same amplitude as the level of the noise, the gating technique then becomes the single most important factor. It is extremely difficult to provide a detector circuit with these requirements which can distinguish the presence of the signal from the noise with a substantial degree of reliability.

In circuits which are used with broad baseband pulse signal devices, this problem is particularly acute because of the wide frequency pass-band of the pulse signal. The problem is further compounded where the amplitude of the baseband pulse signal must be limited so that it does not interfere to any appreciable degree with other radio energy transmissions.

Furthermore, the operational characteristics of a detector are affected by temperature variations and drift in the voltage level provided by power supply sources. As a result, the false alarm rate which is designed into a detector circuit varies in a random fashion thereby affecting the reliability of the "signal-present" indication produced by the detector. The subject invention is a simple apparatus which incorporates a novel method for insuring that the false alarm rate for a single pulse is large enough to be measured whereas the false alarm rate for indicating the presence of a signal is extremely small while also compensating the drift due to temperature and voltage levels in the power supplies to provide a constant false alarm rate detector.

SUMMARY OF THE INVENTION

The present invention is a detector circuit which has a variable threshold level and may be of the type described in the preferred embodiment and referred to as a gated or coincidence detector. The threshold level is sensitive to both noise and input signals applied to the input of the detector. The input circuit includes an avalanche transistor which produces an ampli-fied output signal that is coupled to an N-bit shift register. N parallel outputs are coupled from the shift register to the parallel combination of an N input AND gate and an N parallel input summation circuit. For each pulse produced by the detector circuit a digital 1 is shifted into the N-bit shift register. When N digital 1s are present in the shift register, the N input AND gate provides an output signal that indicates a signal is present. The summation circuit provides an analog output voltage which is proportional to the sum of the digital 1s in the N-bit shift register. The analog voltage is applied to a shunt transistor circuit which has its collector coupled through a long time constant low pass filter to the collector voltage of the avalanche transistor. As the value of the analog voltage applied to the input of the shunt transistor increases, the collector current in the shunt transistor drawn from the collector circuit of the avalanche transistor increases thereby decreasing the collector current in the avalanche transistor which also decreases its sensitivity. The rate at which the collector current in the shunt transistor increases due to drift caused by changes in temperature and/or power supply voltage levels, is usually much slower than the rate of the collector current increase due to the onset of an input signal. Therefore, the sensitivity of the threshold level in the detector of the subject invention is decreased at a rate that is sufficiently fast to compensate for the drift in temperature and power supply voltage level but is sufficiently slow due to the action of the long time constant in the low pass filter that the presence of an input signal can be detected. In this manner the false alarm rate due to noise is maintained constant for each input signal pulse received.

It will be obvious to those skilled in the art while this device is particularly suitable for detecting broad base band pulses of short duration and low signal level, it can also be employed in numerous other applications for which detector circuits are utilized.

DESCRIPTION OF THE PREFERRED EMBODIMENT

Figure 1:
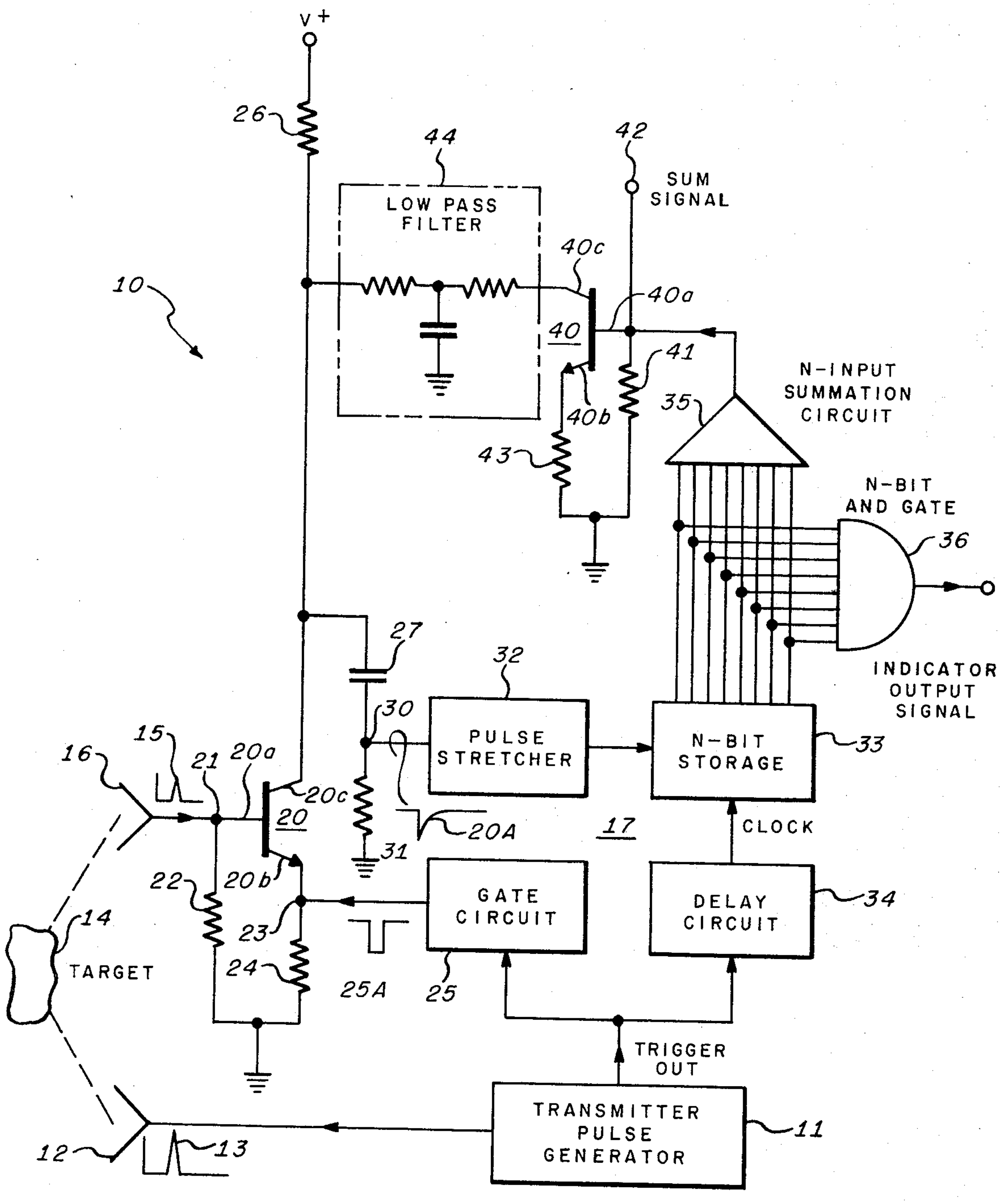
FIG. 1 is a schematic block diagram of the invention incorporated in an object detecting system.

FIG. 1 illustrates an object detection system 10 which includes a transmitter pulse generator 11 coupled to a transmitting antenna 12. These components provide a base-band signal of sub-nanosecond duration such as the pulse 13. The transmitter pulse generator 11 and antenna 12 may be components of the integrated type as described in the transmitter-radiator system taught by G. F. Ross and D. Lamensdorf in the U.S. patent application Ser. No. 46.079 entitled "Balanced Radiation System," filed June 15, 1970 and assigned to the same assignee as the subject invention. The radiated pulse energy is transmitted from the antenna 12 and propagates toward a generally indicated target 14. Reflections of the incident base-band pulse indicated by the attenuated pulse 15 are directed toward a receiving antenna 16 which is coupled to a detector circuit 17.

The detector 17 includes an avalanche transistor 20 which has its base terminal 20*a* connected to a common connection 21 which is in turn connected in parallel to the antenna 16 and through a base resistor 22 to a signal ground. The detector 17 may be of the type taught by E.E. Eves II in the U.S. Pat. application Ser. No. 178,993 entitled, "A Circuit for Detecting Coincidence Between Low Energy Short Pulse Signals," filed Sept. 9, 1971 and assigned to the same assignee as the subject invention. The emitter terminal 20*b* is connected to a junction 23 which is coupled through an emitter resistor 24 to ground and is also coupled to the output of a gate circuit 25 which may be a mono-stable multivibrator. The input of the gate circuit 25 is coupled to an output trigger terminal on the transmitter pulse generator 11.

The collector terminal 20c is coupled through a collector resistor to a voltage source designated V+. The collector terminal 20*c* is also coupled through a capacitor 27 to a common terminal 30 which is coupled through a resistor 31 to signal ground and also coupled to the input of a pulse stretcher network 32 which may be a monostable multivibrator of the same type as used for the gate circuit 25. The output of the pulse stretcher network 32 is coupled to the input of an N-bit storage device 33 which may be an integrated shift register. The clock input terminal of the N-bit storage device 33 is coupled through a delay circuit 34 to the output trigger terminal on the transmitter pulse generator 11. Therefore, data inputs to the N-bit storage device 33, which may be in the form of digital 1s, are shifted at the same rate in the storage device 33 as the pulses are generated by the transmitter pulse generator 11. Each stage of the N-bit storage device 33 has an output which is coupled to one input terminal on an N input summation circuit 35 which is in parallel with one input terminal on an N-bit AND gate 36. The N-bit AND gate provides an indicator output signal when each stage of the N-bit storage device 33 is in a specified state; for example, digital 1.

The output terminal of the N-input summation circuit 35 is coupled to a junction 37 which in turn is connected to the base terminal 40*a* of a transistor 40. Also connected to the junction 37 is one terminal of a base resistor 41 which has its other terminal connected to signal ground and an output test point terminal 42 for observing the sum signal output of the N-input summation circuit 35. The emitter terminal 40*b* is coupled through an emitter resistor 43 to signal ground and the collector terminal 40*c* is coupled through a long time constant low pass filter 44 to the collector terminal 20*c* of the avalanche transistor 20.

Since the N-bit shift register has N number of stages and is clocked at a specific repetition rate which is equal to the repetition rate of the trigger output signals provided by the transmitter pulse generator 11, the parallel outputs of the N-bit shift register are not only indicative of the number of pulses produced by the avalanche transistor 20 but are also indicative of the rate at which these pulses are produced. It is known that the drift in the operational characteristics of an avalanche transistor occurs at a relatively slow rate; usually the changes in the ambient temperature and the voltage levels of the power supplies which are the primary causes of drift occur over periods of time on the order of minutes or hours. In catastrophic failures, the changes occur at extremely rapid rates which are beyond the scope of this invention. Since drift is a slowly varying effect, the time constant of the low pass filter can be made relatively long with respect to the repetition rate and still be sufficient to compensate for the slow drift rate. For example, the time constant of the filter may be made to exceed the repetition rate by a factor of 100 or 1,000.

Further, since the N-bit shift register has a capacity of N-bits and the N input summation device 35 produces an output voltage proportional to the number of digital 1s within the N-bits, the serial combination of the transistor circuit and the long time constant low pass filter can be designed to alter the threshold of the avalanche transistor 20 so that on average over a period of time equal to the time required to shift a digital 1 through the N-bit shift register 33, the number of stored 1s is approximately K wherein K is less than N. Thus, if during quiescent conditions the avalanche transistor 20 produces output pulses due to noise which are truly random, then the probability of the avalanche transistor 20 producing these pulses due to noise is maintained at approximately K/N. This is the probability of a false alarm for a single pulse, $P_{FA}(1)$. Assuming independence from pulse to pulse, the probability of exactly a specific number of false alarms, M, occurring within N successive pulses will be:

$$C_M^N \cdot p^M (1-p)^{N-M}$$

where $p = P_{FA}(1)$.

If the threshold of the avalanche transistor 20 is set such that on average K ones are present in the storage device, then the expression for the probability that *at least* M ones are present in the storage device is $$P(M,N,p) = \sum_{i=M}^{i=N} C_i^N p^i (1-p)^{N-i}$$

where $p = K/N$.

Over a period of time the $N$ input shift register 33 will have on average a number, $K$, of digital 1s stored therein. The values of the circuit components in the serial combination of the transistor circuit and long time constant low pass filter can be determined to adjust the threshold level of the avalanche transistor 20 so that the average number of stored bits is equal to $K$. In a particular embodiment of the disclosed invention which was built and tested, and which is shown in FIG. 1, the number of stages $N$ in the N input shift register 33 was 16, and M was in this case also equal to 16. The probability of false alarm for a single pulse, $p=P_{FA}(1)=K/N$ was adjusted by the closed loop comprised of the serial combination of the transistor circuit and the long time constant low pass filter to insure that $p=1/16$; i.e., $K=1$ and $N=16$. Substituting the foregoing values in the equation for $P(M,N,p)$ yields the probability of false alarms due to noise alone which is $(1/16)^{16}$ or $5.4\times10^{-20}$. It is evident from the foregoing that the probability of false alarms for a single pulse is a measurably large value, that is, $p=1/16$ whereas the probability of N false alarms occurring in N successive pulses is an extremely small value; i.e. $5.4\times10^{-20}$.

It will be appreciated by those skilled in the art that a basic method is involved in achieving the foregoing results, namely, the false alarm rate for a single pulse is continuously measured over a specific period of time and the measured value is utilized to control the sensitivity of the detector in order to maintain the probability of false alarms for a single pulse at a particular value while compensating for drift. Further, the method includes providing a present threshold which requires a significantly high number of successive alarms to produce an indication that an input signal is present which maintains the probability of false alarms due to noise alone at an extremely small level. This basic method can be utilized in a wide variety of applications in analogous arts.

Figure 2:
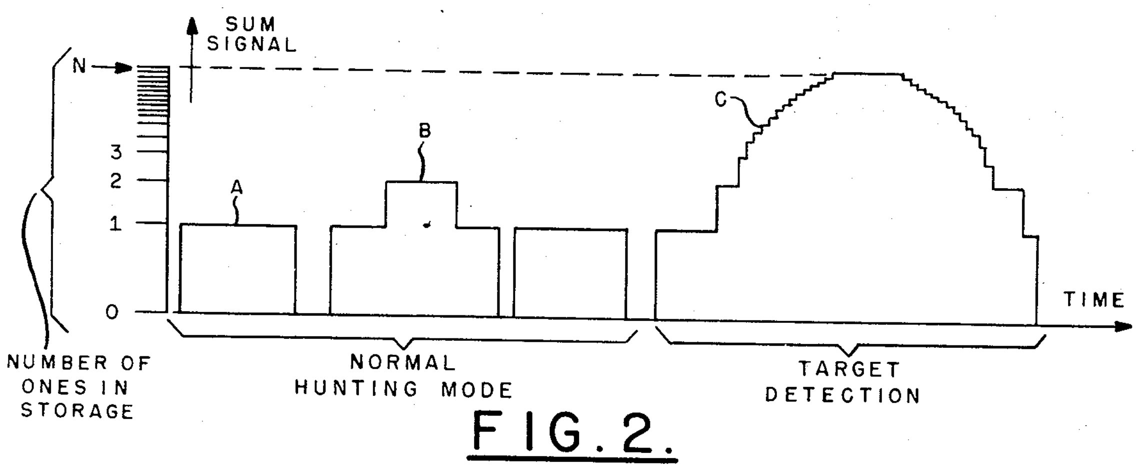
FIG. 2 is a series of typical waveforms present at the output of the summation circuit in FIG. 1 during the no signal mode and signal mode conditions.

During quiescent conditions with no signal present, the system is set in a manner to be described, such that the shift register 33 contains a small non-zero number K of digital 1s. These digital 1s are coupled through the N input summation circuit 35 to provide an analog output voltage that is applied to the base terminal 40a on the shunt transistor 40. This condition is represented by the waveform A as shown in FIG. 2. The shunt transistor 40 will conduct, drawing its collector current through the long time constant low pass filter 44. Thus part of the current through the resistor 26 is diverted through the shunt transistor 40, and the remainder passes into the avalanche transistor 20 and also into the capacitor 27 when it recharges after breakdown of the transistor 20. The avalanche transistor 20 may only break down at certain times, determined by the voltage level applied to its emitter 20b by the gate circuit 25. When breakdown does occur, the capacitor 27 is discharged, producing an output pulse which is coupled into the N-bit shift register 33 as a digital 1, and this level is shifted through the N-bit shift register by successive clock pulses at the same rate as trigger output pulses are produced by the transmitter pulse generator 11.

With no pulse signal 15 present, the transistor 20 sporadically breaks down during some of the gating intervals due to noise present in the circuit. Under quiescent conditions this will produce an average K digital 1s within the shift register 33. When less than K digital 1s are present, the analog output voltage applied to the base terminal 40 a decreases, thereby reducing the collector current through the transistor 40, and in turn increasing the current into the avalanche transistor 20. This has the effect of increasing the sensitivity of the transistor 20 or decreasing its threshold which increases its probability to break down due to a noise spike. When more than K digital 1s are present in the shift register 33 a larger current is diverted through the transistor 40, decreasing the collector current of the transistor 20, thus decreasing its sensitivity, increasing its threshold, and decreases its probability to break down due to a noise spike. Should the contents of the shift register 33 decrease towards zero, then no current will be diverted through the transistor 40, and the resultant current through the avalanche transistor 20 is arranged by appropriate choice of the resistor 22 to exceed the holding current of the avalanche transistor 20, ensuring that breakdown must occur, and digital 1s will enter the shift register 33.

It is essential to the operation of the system that because of the long time constant of the filter 44, the diverted current flowing into the filter 44 does not change abruptly with changes in the shift register contents. Rather, it ensures that *on average* there are K digital 1s present in the shift register 33 at all times that no signal is present.

The object detection system 10 shown in FIG. 1 may be used to monitor the presence of a target within a specific distance of the system 10. The monitored distance is controlled by the pulse width of the gate 25*a* produced in the gate circuit 25 and coupled to the emitter 20*b* of the avalance transistor 20. The time between the occurrence of the transmitted pulse 13 and the leading edge of the gate 25*a* determines the minimum distance monitored and the time between the occurrence of the transmitted pulse 13 and the trailing edge of the gate 25*a* determines the maximum distance that will be monitored by the object detection system 10.

Initially with no target present within the distance monitored by the object detection system 10, independent intermittent noise may be received at the antenna 16. The level of this noise may be sufficient to cause the avalanche transistor 20 to conduct, erroneously indicating a signal is present within the distance monitored. The avalanche transistor will couple an inverted pulse through the capacitor 27 to the input of the pulse stretcher network 32 which produces a digital 1 output and the circuit will operate as described above during quiescent conditions.

When a target is present within the distance monitored by the object detection system 10, a succession of reflected pulses indicated by the attenuated volts 15 in FIG. 1 are received at the receiving antenna 16 and coupled to the base terminal 20*a* of the avalanche transistor 20. Should the input signals be of sufficient magnitude to exceed the instantaneous threshold level of the avalanche transistor 20 and is coincident with the application of the gate pulse from the gate circuit 25 to the emitter terminal 20*b*, the transistor will conduct and produce a succession of pulses which will be applied at the input to the pulse stretcher network 32 which will in turn provide a succession of digital 1s that will be shifted into the N-bit storage device 33. The plurality of digital 1s will be added in the N input summation circuit 35 to produce an analog voltage output as represented by waveform C in FIG. 2. The value of the analog voltage will increase until N digital 1s are shifted into the N-bit storage device 33 at which level the analog voltage produced by the N input summation network 35 will tend to saturate. However, the rapid increase in the amplitude of the analog voltage with respect to time as shown in FIG. 2 does not produce an associated rapid decrease in the sensitivity of the detector 17; i.e., the threshold level is not rapidly increased because the long time constant of the low pass filter 44 does not allow the current shunted through the collector of transistor 40 to increase at the rapid rate of increase in the amplitude of the analog voltage. As a result, in the short period of time required to indicate a target is present, there is an insubstantial change in the sensitivity of the detector 17.

The N input AND gate 36 which has its inputs connected in parallel with the inputs to the AND input summation circuit 35 is essentially a preset threshold device which monitors the parallel output of the N-bit storage device 33 and produces an output signal which indicates an input signal is present only when each stage of the end number of stages in the N-bit storage device 33 contains a digital 1. Since the N input AND gate produces an output signal only when N digital 1s are applied simultaneously to its input terminals, it cooperates with the detector circuit 17 to provide the extremely small probability of false alarms due to noise alone in the preferred embodiment of the subject invention.

Figure 3A:
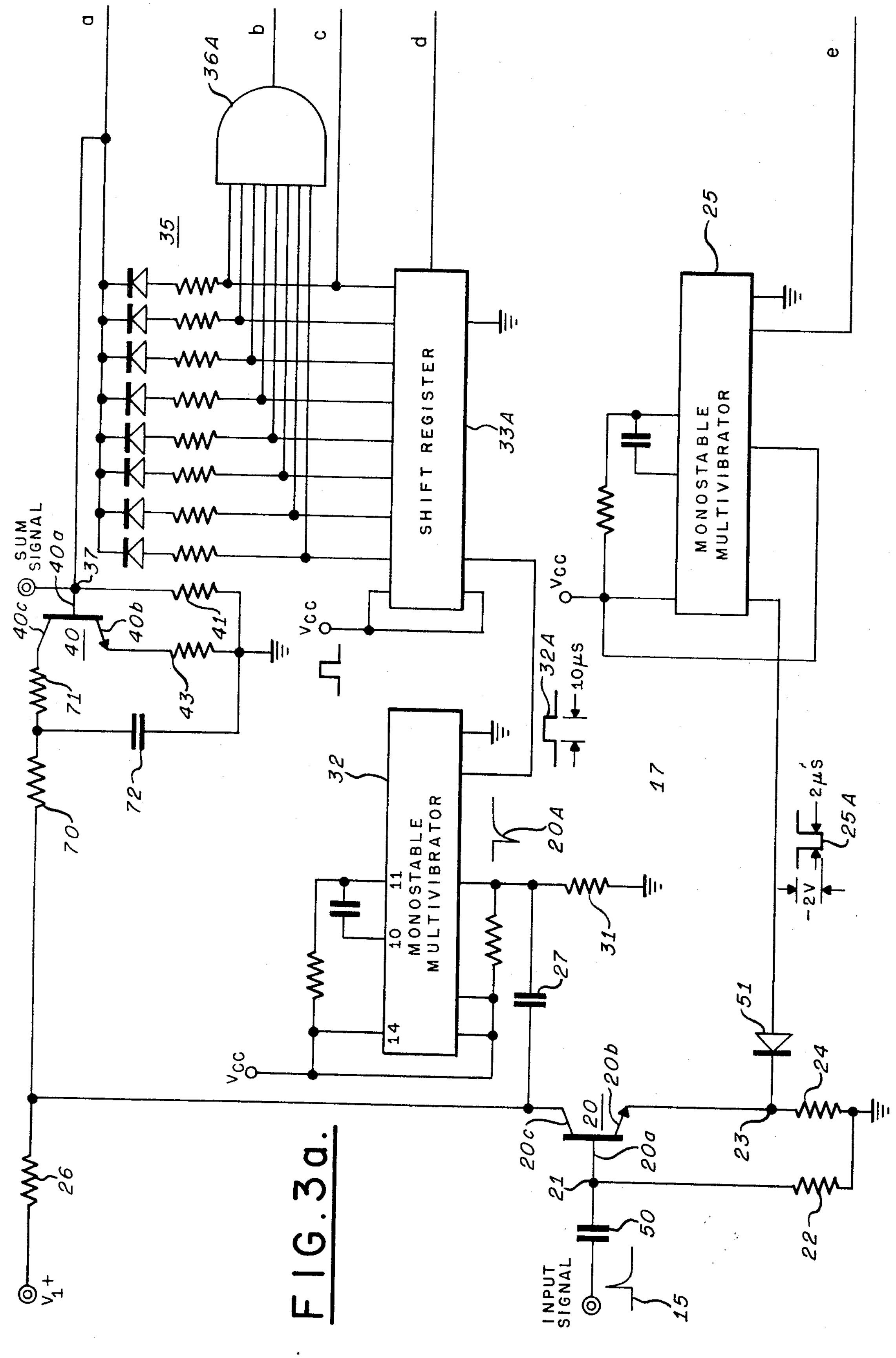
FIGS. 3*a* and 3*b* is a schematic diagram of a coincidence detector reduced to practice which incorporated the subject invention.
Figure 3B:
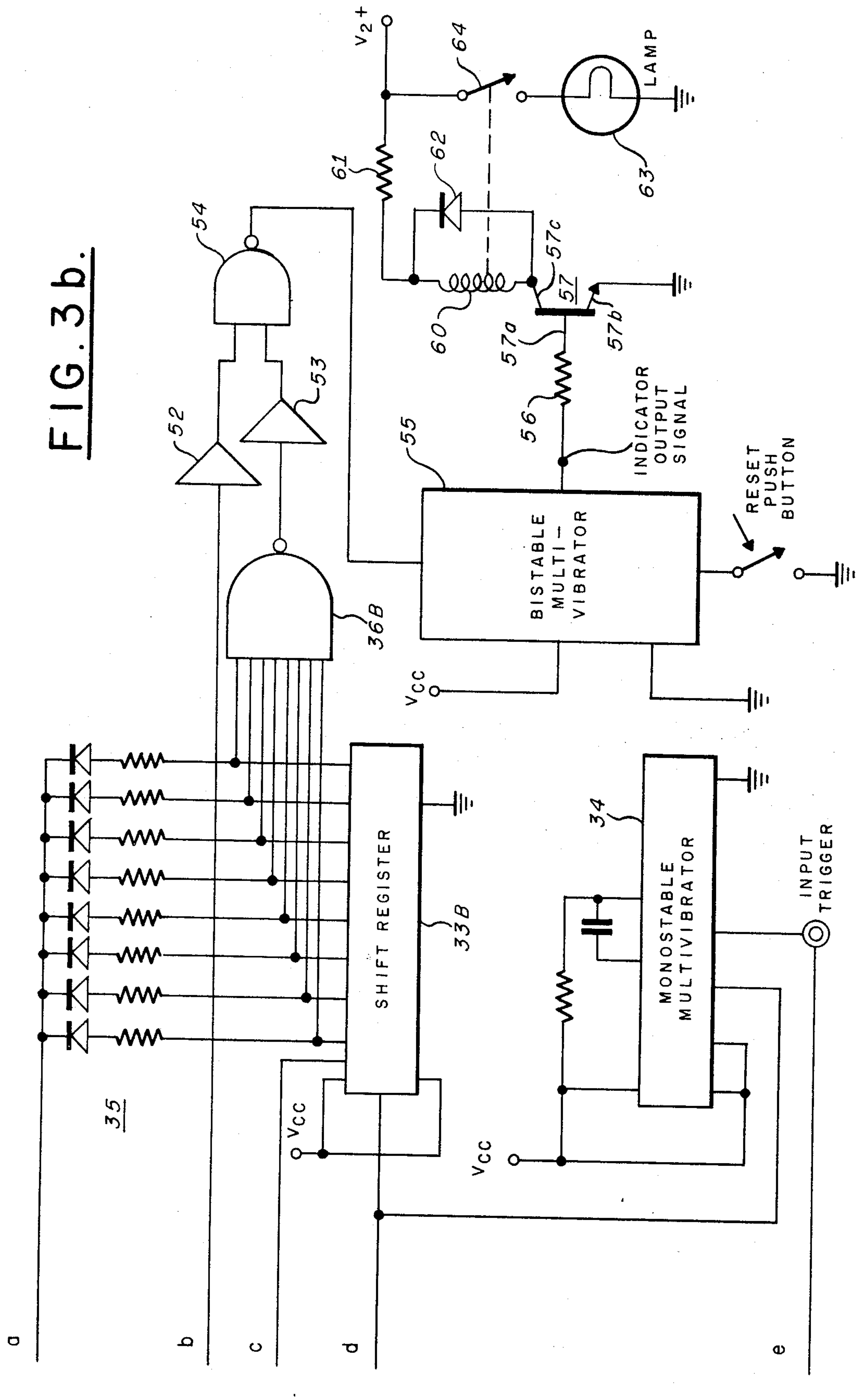

Shown in FIG. 3 is a schematic diagram of a portion of a receiver section actually built and tested for use in an object detection system 10 as shown in FIG. 1. Elements performing common functions in FIGS. 1 and 3 are indicated with the same numbers. A capacitor 50 couples an input pulse signal 15 from a receiving antenna (not shown) to the common junction 21 which was connected through a 510 ohm base resistor 22 to ground and was also connected to the base terminal 20*a* of a 2N5130 avalanche transistor 20. The emitter terminal 20*b* was connected to a junction 23 which was coupled through a 100 ohm emitter resistor 24 to ground. Gate circuit 25 which comprised of an integrated monostable multi-vibrator circuit element, had its output terminal Q coupled through a diode 51 to the junction 23. The collector terminal 20c of the avalanche transistor was coupled through a 2.5K ohm collector resistor 26 to a source of positive voltage designated V+. The junction of the collector resistor 26 and the collector terminal 20*c* was connected through a coupling capacitor 27 to one terminal of a load resistor 31 which had its other terminal connected to ground. The junction of the coupling capacitor 27 and the load resistor 31 was connected to the input terminal of a pulse stretcher 32 which comprised an integrated monostable multivibrator circuit element identical to the one used for the gate circuit 25. The pulse stretcher 32 produced a 10 microsecond wide pulse 32*b* in response to a trigger pulse 32*a* applied at its input trigger terminal.

A N-bit storage device 33 consisted of two integrated shift register elements 33*a* and 33*b* each of which included eight stages. The input terminal of the shift register 33*a* was coupled to the output terminal of the pulse stretcher 32 and had eight parallel outputs each of which was connected in parallel to one input of a 16 input summation circuit 35 and one input of a 16 input AND gate 36. The summation circuit 35 was comprised of 16 parallel networks each of which included a serial combination of a 1,000 ohm resistor and a 1N914 diode. One terminal of each resistor was connected to an output terminal on the 16 bit storage device 33 and the other terminal on each resistor was connected to the anode terminal on its associated diode while the cathode terminals on each of the 16 diodes were connected to the common junction 37.

The 16 input AND gate 36 was comprised of two eight input AND gate integrated circuit elements 36*a* and 36*b* which had their respective eight input terminals connected to the eight output terminals of the respective shift register elements 33*a* and 33*b*. Each of the AND gate elements 36*a* and 36*b* had their output terminals coupled through associated inverter integrated elements 52 and 53 which had their associated output terminals coupled through a two input AND gate 54 which in turn had its output terminal connected to the input terminal of an integrated bistable multivibrator element 55. The output terminal of the bistable multivibrator element 55 was coupled through a coupling resistor 56 to the base terminal 57*a* of a switching transistor 57 which had its emitter terminal 57*b* coupled to ground and its collector terminal 57*c* coupled through the serial combination of the coil of a relay 60 and a collector resistor 61 to a source of positive voltage V+. A suppressor diode 62 was connected in parallel across the terminals of the coil 60. An indicating lamp 63 had one terminal connected to ground and its other terminal coupled to the source of positive voltage V+ through de-energized contacts 64 of the relay 60.

The common junction 37 was coupled to the base terminal 40*a* of the transistor 40 and also coupled through a 1,000 ohm base resistor 41 to ground. The emitter terminal 40*b* was coupled through a 390 ohm emitter resistor 43 to ground and the collector terminal 40*c* was coupled to the output terminal on the filter 44 comprised of the T connected elements: 6.2K ohm resistors 70, 71 and a 200$\mu$ f capacitor 72 which had the other terminal of the capacitor 72 connected to ground. The input terminal of the filter 44 was connected to the junction of the collector resistor 26 and the collector 20*c* of the avalanche transistor 20.

This circuit was operated at a pulse repetition frequency of 10 kHz and successfully detected reflected baseband pulses 15 which were 2 nanoseconds wide and less than 5 millivolts in amplitude. This represents an order of magnitude improvement over prior art circuits which were limited to detecting pulses having an amplitude of greater than 50 millivolts. The amplitude of the gating pulse 25A was −2 volts with the width being very narrow, essentially a Vee-notch approximately 20 nanoseconds wide which is comparable to a distance of 10 feet. An input pulse 15 which was coincident with a gating pulse 25A produced an output pulse 20A from the avalanche transistor 20 which was coupled through the capacitor 27 and load resistor 31 into the monostable multivibrator 32. A 10 microsecond wide pulse 32A was produced by the monostable multivibrator 32 and applied to the input of the shift register 33A which contained the first eight stages of the storage device 33. Digital data in the eighth stage of the shift register 33A was coupled into the first stage of the last eight stages in the storage device 33 which were contained in the shift register 33B. The 10 microsecond wide pulse 32A upon being shifted into the shift register 33A, produced a digital 1 in the first stage thereof and a positive output voltage was applied to the corresponding resistor diode in the summation network 35 and the corresponding input in the 8 input AND gate 36A.

As successive input pulses 15 were received, the shift register 33A filled with digital 1s thereby causing the AND gate 36A to produce an output that was coupled to the inverter 52. When 16 input pulses 15 were received coincident with 16 gating pulses 25A, both shift registers 33A and 33B contained digital 1s in each stage and both AND gates 36A and 36B produced outputs which were coupled to the inverter circuits 52 and 53 respectively. The AND gate 54 received positive inputs from the inverter circuits 52 and 53 and produced a negative output which was applied to the bistable multivibrator 55 to produce a positive indicator output signal. This signal was coupled through base resistor 56 to the base terminal 57*a* of transistor 57 causing it to conduct thereby drawing current through the coil of the relay 60 and the limiting resistor 61. Energizing the relay 60 closed the contacts 64 completing the circuit between the power supply $V_2^+$ through the lamp 63 to ground which provided a visual indication that an object was present within the fixed distance being monitored.

The analog output voltage provided at the output of the summation network 35 was coupled through the transistor circuit comprised of transistor 40, emitter resistor 43 and the base resistor 41 and the filter which consisted of the resistors 70, 71 and capacitor 72 to control the sensitivity of the detector in a manner as described above.

This circuit required no adjustment potentiometers to preset thresholds and was insensitive to variations between individual avalanche transistors within a given type. Further, the circuit maintained a constant false alarm rate over variations of ±10 percent in the power supply voltage and was insensitive to ambient temperature changes over a range of 20° to 90°C. In addition, the accuracy of the −2 volt gating pulse was not significant because if the amplitude tended to drift at a slow rate, the closed loop associated with the avalanche transistor 20 modified the operational characteristics of the circuit including those of the avalanche transistor 20 so that the threshold level of the detector was relatively unaffected by the drift in the amplitude of the gating pulse 25A.

Figure 4:
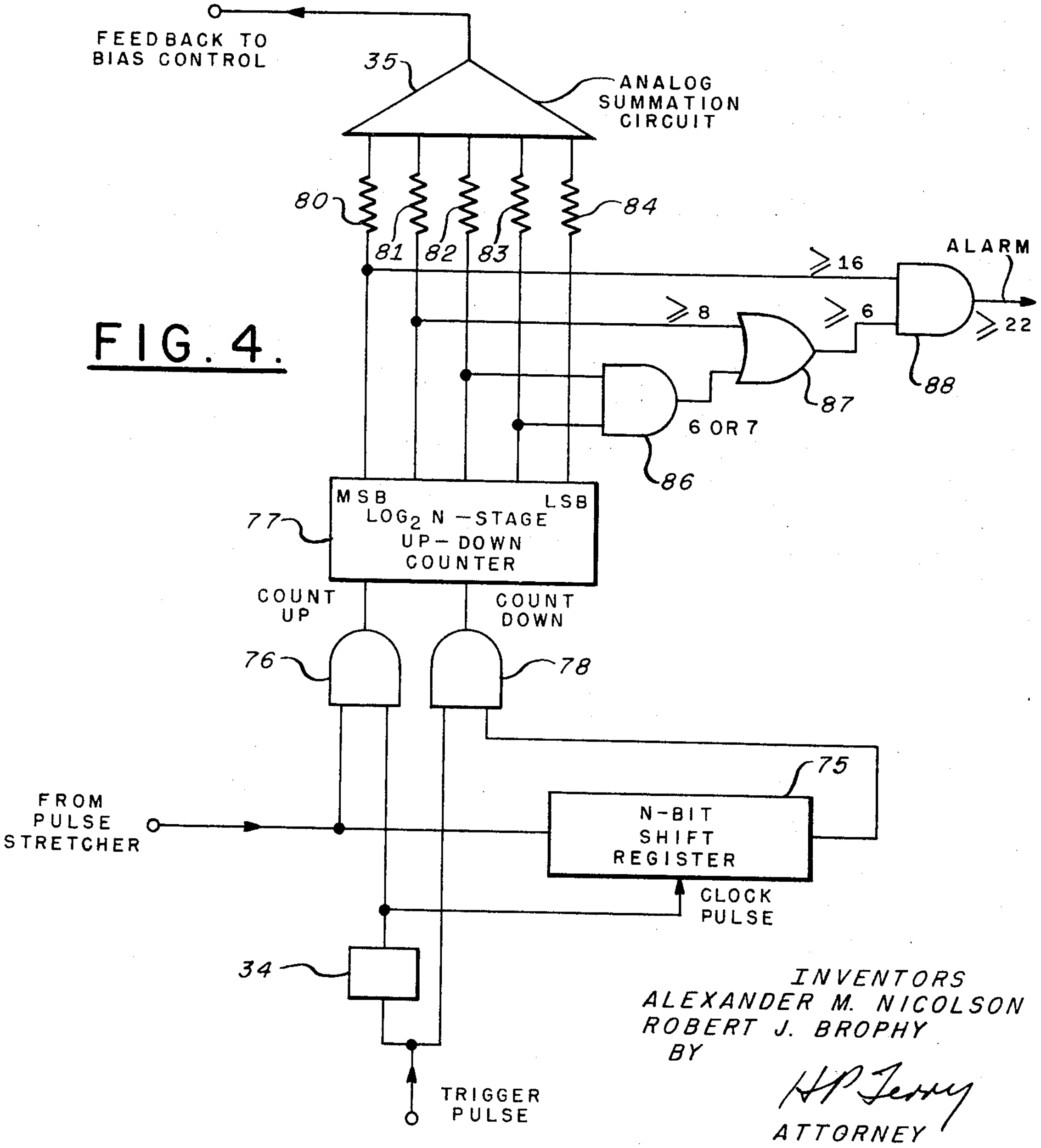
FIG. 4 is a schematic diagram of an alternate embodiment of the invention which includes a $\log_2 N$ stage up-down counter.

An alternate embodiment of the invention as shown in FIG. 4 includes the monostable multivibrator 34 which is responsive to the trigger output pulse from the transmitter pulse generator 11 (not shown) and provides an output pulse signal that is applied as a clock pulse to an N-bit shift register 75 which produces serial output data in response to applied serial input data from the pulse stretcher 32 (not shown). In the preferred embodiment the N-bit shift register 33 shown in FIG. 3 provided parallel output data in response to applied serial input data. The output clock pulse from the monostable multivibrator 34 is applied as one input to an AND gate 76 which has its other input coupled to the output from the pulse stretcher. The output of the AND gate 76 is applied to a count up terminal on $\log_2 N$-stage up/down counter 77. A second input to the counter 77 is applied to a count down terminal from the output terminal of a second AND gate 78 which has one input coupled to the output of the N-bit shift register 75, and its other output coupled directly to the output terminal of the transmitter pulse generator 11. The parallel outputs from the up/down counter 77 are applied to an analog summation circuit 78 which includes a plurality of parallel connected weighted input resistors 80–84 inclusive. The sum output signal from the summation circuit 78 is applied to the common junction 37 as shown in FIG. 3. Coupled in parallel to the input terminals of the resistors 82 and 83 are the input terminals of a two input AND gate 86 which has its output terminal connected to a first input terminal on a two input NOR gate 87. The second input terminal on the NOR gate 87 is connected in parallel to the input terminal on resistor 81. A second two input AND gate 88 has one terminal connected to the output of the NOR gate 87 and its second input connected in parallel to the input terminal of resistor 80 while the output terminal of the gate 88 is connected to the input on the bistable multivibrator 55 (not shown).

In the alternate embodiment assuming an initial condition with no data in the shift register 75 and a zero count in the counter 77, when a pulse is received from the pulse stretcher 32, a count of one will be inserted in the counter 77 through the AND gate 76 if the pulse from the pulse stretcher 32 is coincident with the pulse from the monostable multivibrator 34. At the same time, the pulse from the pulse stretcher 32 will also be inserted in the register 75 as a digital 1. In the absence of successive input pulses from the pulse stretcher 32, after N trigger pulses the digital 1 in the shift register 75 will be coupled through the AND gate 78 to the countdown terminal of the counter 77 and the resultant count will be zero. As can be seen from this process, each pulse received from the pulse stretcher 32 will increment the counter when it occurs and will also decrement the count N bits later. Therefore, the number held in the counter is equal to the number of digital 1s in the last N pulses, but now the serial-in parallel-out N-bit storage device 33 of FIG. 1 has been replaced by a serial-in serial-out N-bit shift register 75, the two AND gates 76 and 78 and the $\log_2 N$ stage counter 77. Although this results in an increase in circuit elements, it provides a significant reduction in cost because a serial-in parallel-out shift register is more expensive than the combined cost of the serial-in serial-out shift register, two AND gates and the $\log_2 N$ stage counter. Further, an added economy is provided by the reduction in the number of connections needed in this alternate embodiment as opposed to the number of connections required in the N parallel outputs of the N-bit storage device 33.

The $\log_2 N$ outputs increase from a least significant bit (LSB) to a most significant bit (MSB) and are applied to the weighted resistors, 80, 81, 82, 83 and 84 which have values of R/16, R/8, R/4, R/2 and R respectively. The outputs of the weighted resistors are fed to the analog summation circuit 35 which produces an output current proportional to the contents of the counter 77. The gates 86, 87 and 88 may be connected so that M out of N decisions may be made. In the embodiment which was actually built and tested an output was applied to an N input AND gate from each stage of the N-bit storage device 33 which meant that M=N. In this alternate embodiment M does not have to equal N and, therefore, more flexibility is provided.

To illustrate the flexibility in this alternate embodiment assume N=32 and the loop is stabilized with a mean content in the counter 77 equal to two digital 1s, then the probability of a false alarm for a single pulse is 2/32. In the particular embodiment shown in FIG. 4, the gates 86, 87 and 88 have been so connected as to indicate a signal input whenever the contents of counter 77 is 22 or greater, i.e., in this example M=22. Using the previous expression, the probability of false alarm due to noise is $P(22,32,1/16)=1.1\times10^{-19}$. Thus, the false alarm rate for a single pulse is approximately the same as that for the previously described system but a lower probability of signal detection on a single pulse is allowed and hence the sensitivity is improved. It should also be noted that an additional saving is provided by this embodiment because the counter has only $\log_2N$ outputs therefore only $\log_2N$ summing resistors are required in the analog summation circuit which is less than the N summing resistors required in the previously described system.

Another alternate embodiment to those described would comprise replacing the $\log_2N$ stage counter 77 with an analog dated dumped integrator which may utilize an operational amplifier with a feedback loop including a capacitor and a resistor. An analog voltage would be stored in the integrator in place of the digital sum in the analog summation circuit 35. This would eliminate the need for summing resistors but may prove less economical because of the requirement for an integrator device.

In summary, apparatus has been described which embody a method for providing a detector with a constant false alarm rate thereby greatly improving the detector sensitivity and also reducing undesirable effects due to variations in power supply voltages, temperature, electrical noise and replacement components.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A detector apparatus which may be subject to temperature variations and includes a power supply source which may be subject to drift for use with a signal source which provides input signals at known repetition rates within a useful frequency band to said detector in an environment where noise is present comprising, variable threshold means coupled to said power supply source and responsive to said input signals and said noise for providing threshold output signals when said input signals or said noise exceed the instantaneous value of said variable threshold, means coupled to said power supply source and to said variable threshold means for producing a variable amplitude output signal which changes amplitude at a rate proportional to the rate at which said threshold output signals are provided, preset threshold means coupled to said power supply source and to said means for producing a variable amplitude output signal which produces an indicator output signal when a pre-determined number of said threshold output signals have been provided, and shunt means coupled between said means for producing a variable amplitude output signal and said variable threshold means for controlling said instantaneous value of said variable threshold in response to said variable amplitude output signal whereby said variable threshold means provides threshold output signals in response to said noise at a constant first rate that is substantially different from a second rate at which said threshold output signals are produced in response to said input signals and said first rate is maintained constant thereby in the presence of temperature variations and drift in said power supply source.

2. A detector apparatus as described in claim 1 in which said variable threshold means includes means in which said variable threshold is varied by controlling the amount of current drawn from said power supply source through said variable threshold means.

3. A detector apparatus as described in claim 1 in which said variable threshold means includes an avalanche transistor operating in its zener mode.

4. A detector apparatus as described in claim 1 in which said detector further includes gating means coupled to said variable threshold means for applying gating signals to said variable threshold means which alter the sensitivity of said variable threshold means.

5. A detector apparatus as described in claim 4 in which said gating means includes means for altering the sensitivity of said variable threshold means at a periodic rate for specific increments of time.

6. A detector apparatus as described in claim 1 which further includes means coupled between said variable threshold means and said means for producing a variable amplitude output signal which increases the duration of said threshold output signals provided by said variable threshold means.

7. A detector apparatus as described in claim 1 in which said means for producing a variable amplitude output signal includes means for storing a plurality of threshold output signals for a specific period of time.

8. A detector apparatus as described in claim 7 in which said means for producing a variable amplitude output signal further includes means for summing said plurality of threshold output signals stored in said means for storing.

9. A detector apparatus as described in claim 8 in which said means for summing produces a variable amplitude output signal which varies at a rate determined by the number of threshold output signals coupled into said means for storing for a specific period of time.

10. A detector apparatus as described in claim 7 in which said means for storing includes an analog gated dumped integrator.

11. A detector apparatus as described in claim 7 in which said shunt means includes means for establishing an average number of threshold outputs that will be produced by said variable threshold means over said specific period of time.

12. A detector apparatus as described in claim 11 in which said means for establishing said average number of threshold outputs over said period of time includes a transistor circuit having an emitter resistor with a resistance value which may be selected to determine said average number of threshold output signals that will be stored in said storage means over said specific period of time.

13. A detector apparatus as described in claim 1 in which said variable threshold means for producing a variable amplitude output signal includes a series circuit comprising a shift register storage device and a summation circuit.

14. A detector apparatus as described in claim 13 in which said storage device includes a serial-in parallel-out N-bit shift register.

15. A detector apparatus as described in claim 13 in which said storage device includes a serial-in serial-out N-bit shift register and a $\log_2N$ stage up/down counter.

16. A detector apparatus as described in claim 1 in which said preset threshold means includes means for producing an indicator output signal when said means for producing a variable amplitude output signal produces a maximum amplitude output signal.

17. A detector apparatus as described in claim 1 in which said preset threshold means includes logic circuit means for providing an indicator output signal when said means for producing a variable amplitude output signal produces an output signal which is a specified fraction of a maximum output signal.

18. A detector apparatus as described in claim 1 in which said shunt means includes means which shunts a minimum amount of current from said variable threshold means when said number of said threshold output signals are a minimum and shunts a maximum amount of current when said number of said threshold output signals are a maximum.

19. A detector apparatus as described in claim 18 in which said shunt means further includes means for controlling the rate at which said current through said shunt means is varied.

20. A detector apparatus as described in claim 19 in which said means for controlling the rate at which said current through said shunt means is varied permits said current to vary at a slow rate when said variable amplitude output signal changes at a slow rate but inhibits said current from varying at a fast rate when said variable amplitude output signal changes amplitude at a fast rate.

21. A detector apparatus as described in claim 1 in which said shunt means includes a series circuit comprising a low pass filter having a specific time constant and a transistor circuit.

22. A method for providing a constant false alarm rate in an apparatus for detecting input signals within a useful frequency band in an environment where noise is present comprising the steps of, sensing input signals in a variable threshold means that are in excess of an instantaneous value of said variable threshold, sensing noise in said variable threshold means that is in excess of said instantaneous value of said variable threshold, producing detected output signals in response to said sensed input signals, producing detected output signals in response to said noise, producing a variable amplitude output signal proportional to the rate at which said detected output signals are produced, sensing in a preset threshold device when a plurality of said detected output signals are produced in excess of said preset threshold, producing an indicator output signal when said detected output signals exceed said preset threshold, and controlling said instantaneous value of said variable threshold in said variable threshold means with said variable amplitude output signals whereby said detected output signals produced in response to said noise are produced at a constant rate that is less than the rate said detected output signals produced in response to said input signals.

23. A method for providing a constant false alarm rate in an apparatus for detecting input signals as described in claim 22 which further includes the steps of, gating said variable threshold means at specified repetition rates for a pre-determined period of time thereby increasing the sensitivity of said threshold means for said periods of time, and storing said detected output signals for a fixed number of repetition rates.

24. A method for providing a constant false alarm rate in an apparatus for detecting input signals as described in claim 22 which further includes the steps of, varying said instantaneous value of said variable threshold at a rate commensurate with said rate at which said detected output signals are produced in response to said noise, and varying said instantaneous value of said variable threshold in said variable threshold means at a rate that is substantially less than the rate said detected output signals are produced in response to said input signals.

25. A method for providing a constant false alarm rate in an apparatus for detecting input signals within a useful frequency band in an environment where noise is present comprising the steps of, applying input signals of sufficient magnitude to the base terminal of an avalanche transistor operating in the zener mode to cause reverse breakdown in said avalanche transistor, applying noise of sufficient magnitude to said base terminal of said avalanche transistor to produce reverse breakdown, producing avalanche transistor output signals in response to said applied input signals, producing output signals in response to said noise, increasing the pulse width of said output signals produced by said avalanche transistor, storing a plurality of said pulses as digital 1s in a counter, sensing in a preset threshold device when a plurality of said stored digital 1s are in excess of said preset threshold, producing an indicator output signal when said stored digital 1s exceed said preset threshold, producing a variable amplitude analog output voltage proportional to the rate at which said avalanche transistor detector produces output signals, applying said analog output voltage to the base terminal of a shunt transistor circuit to control the amount of current drawn through said transistor, and controlling the rate at which the current is drawn through said transistor circuit thereby current is varied at a rate which is commensurate with the rate of change in said amplitude of said analog output voltage when said voltage is produced in response to said noise but the rate at which said current is varied is substantially less than the rate at which said amplitude of said analog output voltage is changed in response to detector output signals produced by said input signals.

* * * * *